United States Patent [19]

Sotak

[11] Patent Number: 4,843,321
[45] Date of Patent: Jun. 27, 1989

[54] METHOD FOR VOLUME LOCALIZED SPECTRAL EDITING OF NMR SIGNALS PRODUCED BY METABOLITES CONTAINING COUPLED SPINS

[75] Inventor: Christopher H. Sotak, Alameda, Calif.

[73] Assignee: General Electric Company, Milwaukee, Wis.

[21] Appl. No.: 181,956

[22] Filed: Apr. 15, 1988

[51] Int. Cl.$^4$ ............................................ G01R 33/20
[52] U.S. Cl. .................................. 324/309; 128/653; 324/311
[58] Field of Search ............... 324/307, 309, 311, 312, 324/314; 128/653

[56] References Cited

U.S. PATENT DOCUMENTS

| | | | |
|---|---|---|---|
| 4,134,058 | 1/1979 | Ernst | 324/307 |
| 4,701,708 | 10/1987 | Hardey et al. | 324/311 |
| 4,706,024 | 11/1987 | Dumoulin | 324/309 |
| 4,739,266 | 4/1988 | Kunz | 324/309 |
| 4,748,409 | 5/1988 | Frahm et al. | 324/309 |
| 4,777,439 | 10/1988 | Granot | 324/309 |

FOREIGN PATENT DOCUMENTS 0089034 9/1983 European Pat. Off. ............ 324/307

OTHER PUBLICATIONS

"Multiple Quantum NMR Spectroscopy", *Spectroscopy*, vol. 1, No. 0, pp. 20–26, Dumoulin (General Electric Company).

"Two-Dimensional Nuclear Magnetic Resonance in Liquids", AD Bax, Colorado State University, Dept. of Chemistry, pp. 128–155.

"Homonuclear H Double-Resonance Difference Spectroscopy of the Rat Brain in Vivo", *Proc. Natl. Acad. Sci. U.S.A.*, vol. 81, pp. 6630–6334, Oct. 1984, Rothman et al.

"A Method for Lactate Detection in Vivo by Spectral Editing Without the Need for Double Irradiation", Williams et al., *Journal of Magnetic Resonance*, 66, 1986, pp. 562–567.

"H Homonuclear Editing of Rat Brain Using Semiselective Pulses", Hetherington et al., *Proc. Natl. Acad. Sci. U.S.A.*, vol. 82, pp. 3115–3118, May 1985.

"Multiple Quantum Spectroscopy", Emid, S., Dept. of Applied Physics, Delft University of Technology, The Netherlands, vol. 4, No. 3/4, pp. 99–104.

"The Application of Multiple-Quantum Techniques for the Suppression of Water Signals in H NMR Spectra", Dumoulin, Charles, *Journal of Magnetic Resonance*, 64, 38–46 (1985).

"High Resolution, Zero Quantum Transition (Two-Dimensional) Nuclear Magnetic Resonance Spectroscopy: Spectral Analysis", Pouzard et al., *Journal of the American Chemical Society*, 103, 1981, pp. 4209–4215.

"Volume-Selective Multipulse Spin-Echo Spectroscopy", Kimmich et al., *Journal of Magnetic Resonance* 72, pp. 379–384 (1987).

"Selected Volume Excitation Using Stimulated Echoes (VEST). Applications to Spatially Localized Spectroscopy and Imaging", Granot, Joseph, *Journal of Magnetic Resonance* 70, pp. 488–492, (1986).

"Localized Proton Spectroscopy Using Stimulated Echoes", Frahm et al., *Journal of Magnetic Resonance* 72, pp. 502–508 (1987).

"A Pulse Sequence for Simplifying Hydrogen NMR Spectra of Biological Tissues", Rothman et al., *Journal of Magnetic Resonance* 60, pp. 430–436 (1984).

*Primary Examiner*—Stewart J. Levy
*Assistant Examiner*—Kevin D. O'Shea
*Attorney, Agent, or Firm*—Quarles & Brady

[57] ABSTRACT

An NMR method for acquiring the in vivo proton spectra of spin-spin coupled metabolites employs a pair of stimulated echo pulse sequences (90-TE/2-90-$t_1$-90-TE/2). The period TE/2 is set to optimize the signal components produced by the coupled spins of the metabolites. The value of period $t_1$ is different for the two pulse sequences and the difference between the two resulting NMR echo signals provides the desired spectra.

5 Claims, 4 Drawing Sheets

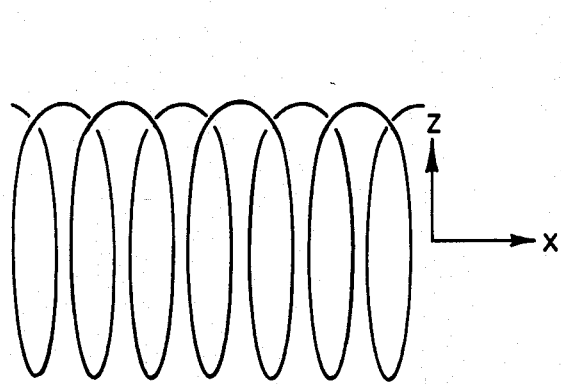
FIG. 5a
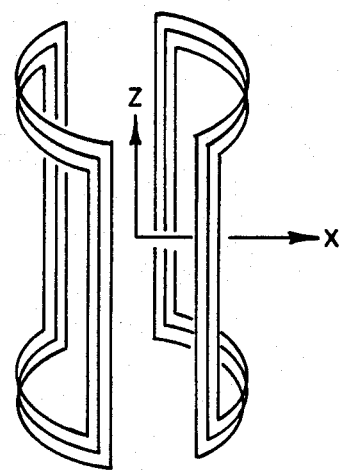
FIG. 5b
FIG. 5c
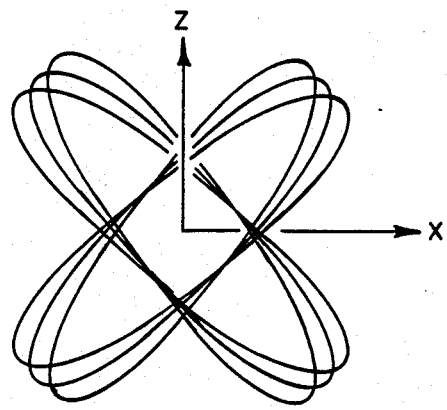
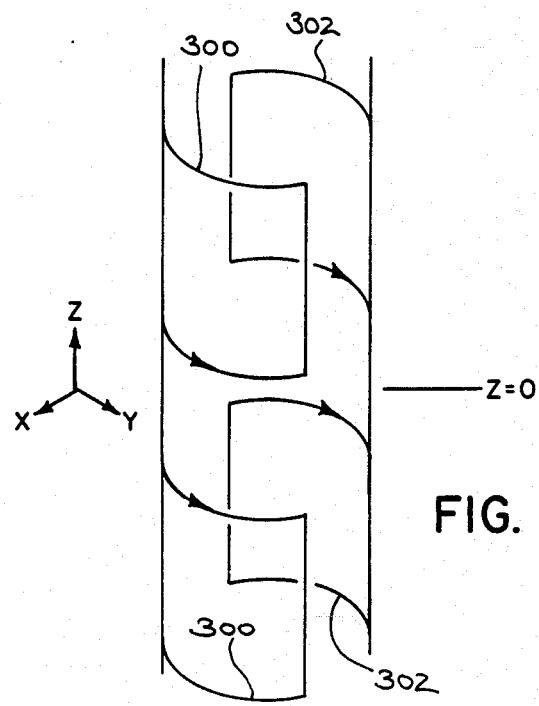
FIG. 6a
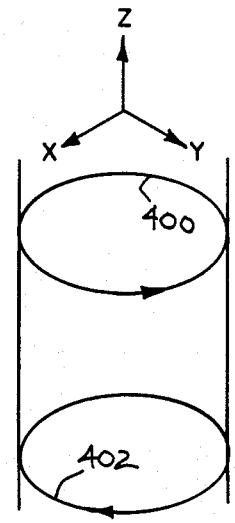
FIG. 6b

METHOD FOR VOLUME LOCALIZED SPECTRAL EDITING OF NMR SIGNALS PRODUCED BY METABOLITES CONTAINING COUPLED SPINS

BACKGROUND OF THE INVENTION

The field of the invention is nuclear magnetic resonance (NMR) spectroscopy and, more particularly, methods for removing unwanted spin resonance response signals from an NMR signal.

It is well known that nuclear magnetic resonance (NMR) in-vivo phosphorous ($^{31}$P) spectroscopy is a useful tool for monitoring human metabolism. However, in-vivo phosphorous spectroscopy suffers from the relatively long time interval required for acquisition of a spectrum with reasonable signal-to-noise ratio. The length-of-time problem can be avoided if hydrogen ($^1$H) spectroscopy is utilized, instead of phosphorous spectroscopy, because the NMR sensitivity of hydrogen is roughly fifteen times as great as the phosphorous sensitivity. As a result, hydrogen spectroscopy has a data-collection time which may be two, or more, orders of magnitude less than the data-collection time for phosphorous, if the same signal-to-noise ratio is to be achieved.

However, it is well known that $^1$H spectroscopy suffers from another problem—the presence of uncoupled spin resonances from components, such as water and the presence of unwanted coupled-spin resonances, such as those from lipids. These undesired spin resonances are typically three to four orders of magnitude larger than the spectral peaks of interest. Further, these undesired spin resonances are positioned approximately at the same spectral position as the desired metabolite peaks, rendering the detection of the desired metabolite peaks virtually impossible by conventional NMR techniques. Accordingly, it is highly advantageous to provide a method for acquiring spin resonance response from coupled hydrogen spins in metabolites in the presence of other in-vivo human tissue components such as water and lipids.

Several NMR methods have been proposed which utilize a narrow bandwidth RF excitation pulse which is centered at the frequency of the offending spectral peak, and which suppresses the unwanted resonance peak in the total acquired NMR response spectrum. The most straightforward approach is the application of a long presaturating RF excitation pulse utilized to suppress the offending signal peak response (usually that of a water resonance) prior to receiving and processing the desired spectrum. Another technique, popularly known as "1-3-3-1", utilizes a series of 90°, RF excitation pulses with interleaved delays, to maneuver the undesired spin magnetization into a longitudinal direction, while the spin magnetization of the desired resonances are maneuvered into the transverse plane where they produce a detectable NMR signal. These techniques are limited because they also suppress desired spin resonant components which are at or near the frequency of the suppressed component, and they do not suppress other undesired spin resonant components at other frequencies.

Still other techniques are known which discriminate against the water resonance peak by taking advantage of the differences in the spin-lattice relaxation time $T_1$ and the spin-spin relaxation time $T_2$ between the undesired water spins and other chemical spins. Thus, long echo times can be effectively utilized to suppress the water peak in some tissues, while leaving other resonances, such as that of lactate, substantially unaffected. Many of the undesirable lipid resonances are also affected by this technique and are attenuated in the acquired NMR signal.

Other methods utilize an inverting pulse, having a delay equal to the null time constant ($T_{null}$) of the undesired spin component (water), prior to readout. While suppressing the latter resonance, these methods also partially suppress the desired metabolite resonance peaks and do not, in general, suppress other undesired (lipid) spin resonances.

Several existing methods suppress unwanted NMR response signals produced by uncoupled spin resonances by utilizing the scalar coupling which exists between adjacent atoms of the same molecule. The spins are nutated into the transverse plane and are acted upon by a sequence of RF excitation pulses and delays which cause the spin magnetization produced by the desired coupled atoms to evolve in a manner different from the manner in which spin magnetizations produced by the uncoupled spins evolve. Some such techniques, such as the Homonuclear Polarization Transfer technique, use a nonselective 90° RF excitation pulse and a delay to invert the phase of all coupled spins having a particular coupling constant J. Such methods cannot, however, suppress lipid resonances which are coupled to one another. This disadvantage may be overcome with yet another method, known as Homonuclear Double-Resonance Difference Spectroscopy, which allows retention of certain coupled peaks, such as the lactate resonance, while excluding certain other resonances, such as the lipid alkyl resonances. This method applies a selective 180° RF excitation pulse which is centered on one of the lactate peak frequencies to only invert the phase of the lactate resonance peak, to which the first resonance peak is coupled. This occurs only if the frequency of the selective pulse is correctly set to within about 1 Hz, and an incorrect frequency will cause the original lactate peak to be distorted in phase or amplitude, and may result in the desired signal components cancelling one another in the final NMR signal.

SUMMARY OF THE INVENTION

The present invention relates to a method for producing an NMR signal which indicates the in vivo proton spectra of metabolites at their naturally occurring concentration by selectively suppressing interfering signals. More specifically, the present invention includes the steps of: applying a polarizing magnetic field to the region of interest; applying an RF excitation field pulse to the region of interest to produce transverse magnetization; applying a second RF excitation field pulse to the region of interest after a time period (TE/2) which is a function of the spin-spin coupling constant (j) of the metabolite molecule; applying a third RF excitation field pulse to the region of interest after a second time period ($t_1$) which is a function of the zero quantum modulation frequency (ZQMF) of the metabolite molecule; acquiring the resulting echo NMR signal; repeating the pulse sequence with a different second time period ($t_1$); and producing a difference signal by subtracting one of the acquired echo NMR signals from the other acquired echo NMR signal.

A general object of the invention is to suppress NMR signal components which are not produced by the metabolite molecule. By selecting the first time period (TE/2) as a function of the molecule's spin-spin coupling constant, the amplitude of the desired signal components are maximized while the undesired components are not. By selecting the two second time periods ($t_1$) as a function of the molecule's zero quantum modulation frequency (ZQMF), signal components produced by the metabolite molecule are amplitude modulated while signal components produced by other coupled spins, such as that produced by lipids, are not modulated. As a result, when the difference signal is produced, the undesired signal components cancel while the modulated signals produced by the metabolite molecule yield a net signal.

A more specific object of the invention is to localize the region from which the NMR signals are acquired. Position encoding magnetic field gradients may be applied when each of the three RF excitation pulses are applied and the RF excitation pulses are limited in frequency bandwidth to select slices along the direction of each gradient field. The NMR signal is produced by the region of interest at the intersection of the three selected slices.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1b is a graphic representation of the spectral components produced by the lactate molecule of FIG. 1a;

FIGS. 5a–5c are schematic drawings of RF coils which may be employed in the NMR system of FIG. 4; and FIGS. 6a and 6b are schematic drawings of the gradient coils employed in the NMR system of FIG. 4.

DESCRIPTION OF THE PREFERRED EMBODIMENT

Figure 1A:
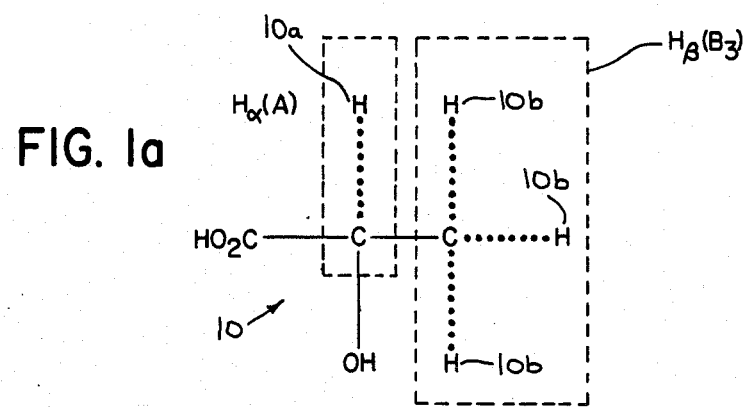
FIG. 1a is a schematic representation of a lactate molecule which produces an NMR signal having a number of spectral components.

Referring initially to FIG. 1a, a molecule 10 from which NMR spectroscopic information is to be obtained is illustrated. Molecule 10 is a type $AB_3$ molecule, such as a lactate molecule, in which scalar coupling exists between a single hydrogen atom 10a, having a single bond with a middle carbon atom in the $H\alpha(A)$ moiety, and three hydrogen atoms 10b, each having a bond with an end carbon atom in the $H\beta(B_3)$ moiety. When this molecule is subjected to a polarizing magnetic field $B_0$ and a transverse RF excitation field $B_1$ is applied, an NMR signal is produced by this molecule which has a number of resonant peaks.

Since the $H\alpha(A)$ hydrogen atom 10a can have the spin of its nucleus pointing either up or down, the nuclear spins of the $H\beta(B_3)$ atoms 10b encounter one of two different local environments, so that the peak of their resonance is split into a doublet of spectral lines, each of a substantially similar amplitude. Similarly, the three β hydrogen atoms 10b can assume spin configurations with any one of: all three spins pointing in the upward direction, one spin in the downward direction and the other two spins in the upward direction, two spins in the downward direction and one spin in the upward direction, or all three spins in the downward direction. Therefore, the α hydrogen atom 10a sees four different environments and its resonance is split into a quartet of spectral lines, having relative intensities 1:3:3:1.

Figure 1B:
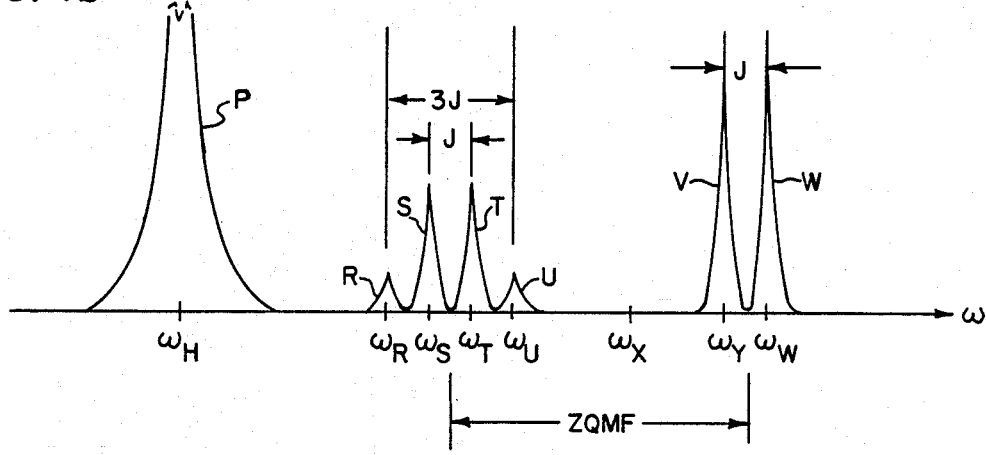

An example of the transformed NMR signal produced by the in-vivo lactate molecule is shown in FIG. 1b. The NMR signal has been converted to the frequency domain such that its signal components are shown as peaks, or "spectral components", at different frequencies along the horizontal frequency axis. One spectral component produced by the hydrogen nuclei in water is shown at the frequency $\omega_H$, although it can be appreciated by those skilled in the art that there are typically many other unwanted spectral components present which are produced by uncoupled resonant spin. These other spectral components are often many orders of magnitude greater than the lactate spectral components.

The NMR signal components due to the α hydrogen spin resonance $H\alpha(A)$ of the illustrative lactate molecule 10 provides the quartet of spectral components R, S, T and U at respective frequencies $\omega_R$, $\omega_S$, $\omega_T$ and $\omega_U$. Each of these peaks are separated by the spin-spin coupling constant J which is approximately 7.3 Hz. The β hydrogen resonances $H\beta(B_3)$ provide the doublet spectral components V and W, at respective frequencies $\omega_V$ and $\omega_W$. The separation therebetween is determined by the same spin-spin coupling constant J. The spacing between the center of the quartet and the center of the doublet is referred to as the chemical shift difference which is equal to the zero quantum modulation frequency (ZQMF). In the example, the ZQMF is equal to 250 Hz at 2 Tesla. It will be seen that the relatively huge amplitude of the uncoupled spin resonance component P as well as the resonance components due to noncoupled lipids dwarfs the much smaller amplitudes of the desired coupled spin spectral components R-W, so that any attempt to acquire the coupled spin spectral components is exceedingly difficult, if not impossible. The present invention is a method for at least partially, if not completely, suppressing unwanted spectral components, while providing a usable spectrum of components R, S, T, U, V or W.

The method of the present invention is practiced using a 2.0 Tesla image spectrometer such as that sold commercially by the General Electric Company as the GE CSI-II imaging spectrometer equipped with self-shielded gradients.

Figure 2:
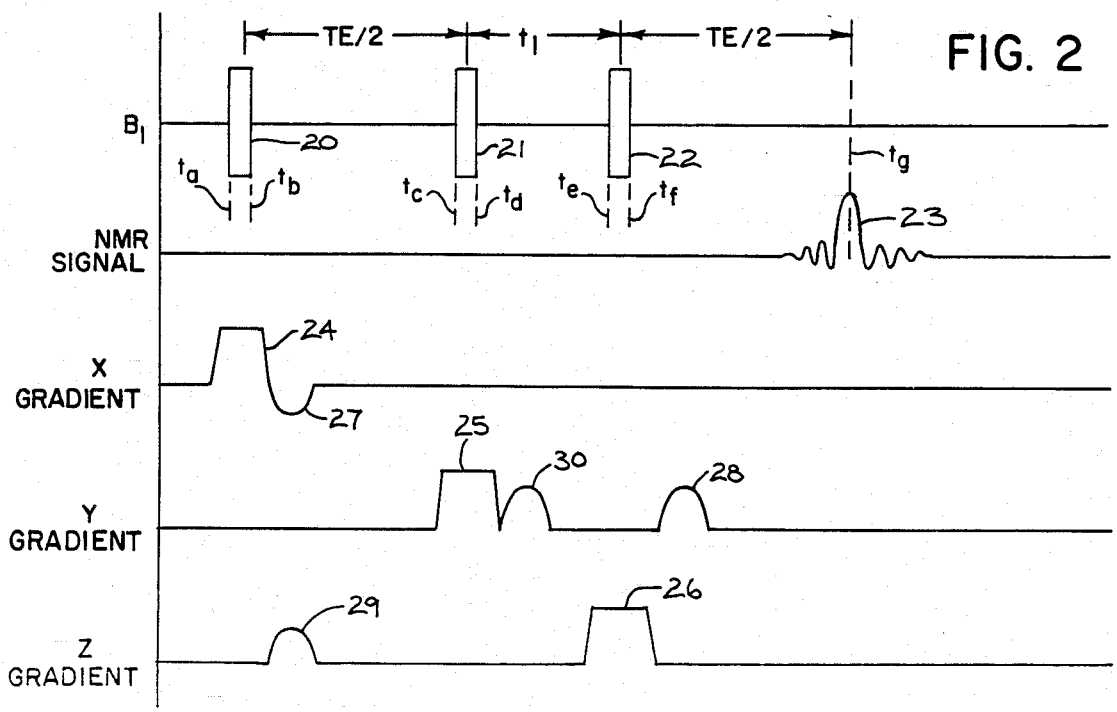
FIG. 2 is a graphic representation of the pulse sequence employed in an NMR spectrometer to practice the preferred embodiment of the present invention.

The pulse sequence which is employed is illustrated in FIG. 2. It includes the application of three selective 90° RF excitation pulses 20, 21 and 22, and the acquisition of the resulting NMR echo signal 23. The RF excitation pulses are 4 millisecond, 3 lobe, sin x/x pulses having a frequency bandwidth of 1,500 Hertz. The RF excitation transmitter frequency is positioned between the two coupled spins at 2.7 parts per million. Magnetic field gradients are applied in the x, y and z directions to localize the NMR response to a selected location in the subject of interest. More specifically, an x gradient pulse 24 is applied during the application of the first RF excitation pulse 20 to select a slice along the x axis, a y gradient pulse 25 is applied during the second RF excitation pulse 21 to select spins in a slice along the y axis, and a z gradient pulse 26 is applied during the third RF excitation pulse 22 to select spins in a slice along the z axis. As a result, the NMR echo signal 23 is produced by a rectangular volume which is located at the intersection of all three slices. Respective x, y and z gradient pulses 27, 28 and 29 are also employed to rephase spins in a well known manner, and a y gradient homospoil pulse 30 dephases spins outside the region of interest so that it does not produce an NMR signal.

A number of other methods for using magnetic field gradients to localize the NMR echo signal produced in a stimulated echo sequence are known to the art and can be employed to practice the present invention. Examples of the method described herein and of such other localizing methods are described by J. Frahm, K. D. Merboldt, and W. Hanicke in *The Journal of Magnetic Resonance* 72, 502 (1987); by J. Granot in *The Journal of Magnetic Resonance* 70, 488 (1986); and by R. Kimmich and D. Hoepfel in *The Journal of Magnetic Resonance* 72, 379 (1987).

The stimulated echo pulse sequence is a sequence in which the first pair of selective 90° RF pulses separated by the delay (TE/2) create multiple quantum, or alternatively, zero quantum, coherence of the spin populations in the localized NMR spin system. This coherence of the spin populations evolves during the subsequent time period ($t_1$) and with coupled spins this results in the amplitude modulation of the detected NMR signal. Spin resonances which are not coupled to other spin resonances (as is the case with water and part of lipid signal) do not exhibit multiple quantum behavior and do not, therefore, experience modulation during the time period ($t_1$). By executing the stimulated echo pulse sequence twice with different time periods ($t_1$), and by taking the difference between the two resulting NMR echo signals 23, a signal is produced in which the signal components due to uncoupled spin resonances cancel and the signal components due to selected coupled spin resonances produce a difference signal. This difference signal is used to produce the desired signal for display.

Figure 3A:
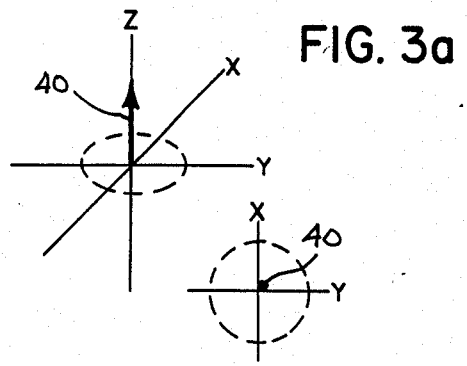
FIGS. 3a–3h are schematic representations of the spin magnetization at various stages of the pulse sequence of FIG. 2.
Figure 3B:
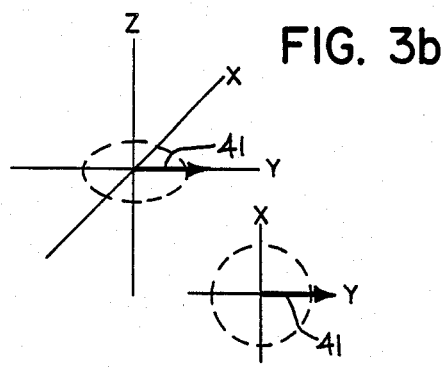
Figure 3C:
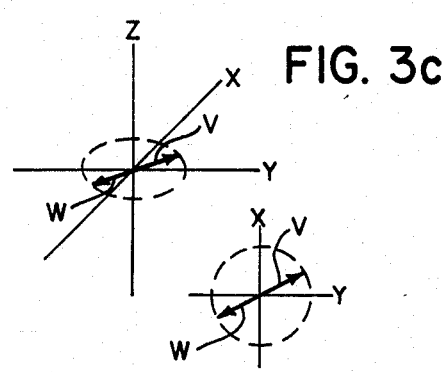

This phenomenon is illustrated graphically in FIGS. 3a–3h in which the cartesian coordinates are rotating about the z axis at the frequency of the excitation field $B_1$. Referring particularly to FIGS. 2 and 3, at the beginning of the pulse sequence, all of the spin magnetization is aligned along the z axis in the direction of the polarizing magnetic field $B_0$ as indicated by the vector 40 in FIG. 3a. At the time $t_a$, the first selective 90° RF excitation pulse 20, applied in this case along the x-axis of the rotating frame, tips the magnetization into the transverse plane (i.e. x-y plane) where, at the time $t_b$, the spin magnetization of the various components are in phase and aligned along the y-axis of the rotating frame as shown at 41 in FIG. 3b. Because these various components have slightly different Larmor frequencies, they immediately begin to dephase from one another. This is illustrated in FIG. 3c for the spin magnetizations V and W of the β hydrogen doublet in the lactate molecule for a particular resonance offset from the transmitter frequency. Because one rotates 7.35 Hz faster than the other, they are out of phase with each other after the first time period TE/2. By properly selecting the time period TE/2, therefore, the V and W spin magnetization components will be 180° out of phase at the time $t_c$ when the second RF excitation pulse 21 is generated. In other words, TE/2 is selected in accordance with the following formula to provide full "j-modulation" of the coupled spin.

$$TE/2 = n/2j$$

where:
  n = odd integer, 1-3-5 . . .
  j = spin-spin coupling constant

In the preferred embodiment described herein n is chosen as "1" and the spin-spin coupling constant (j) is 7.3 Hz as indicated above. TE/2 is, therefore, set to 68 milliseconds.

Figure 3D:
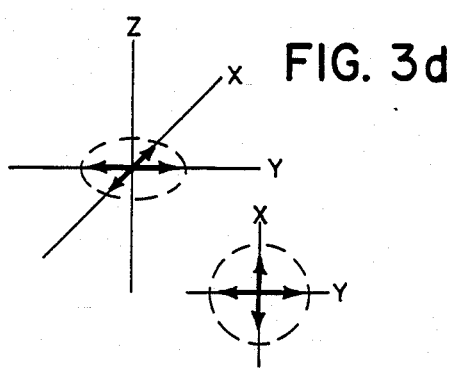
Figure 3E:
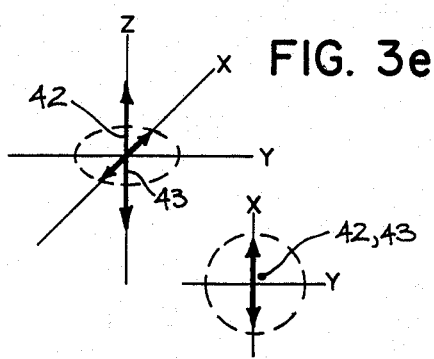
Figure 3F:
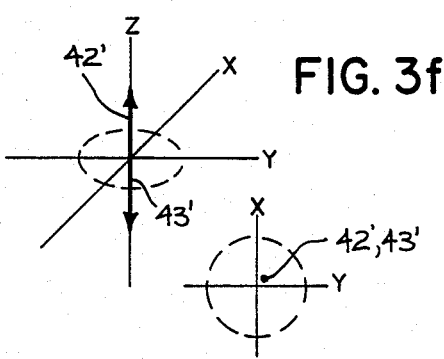
Figure 3G:
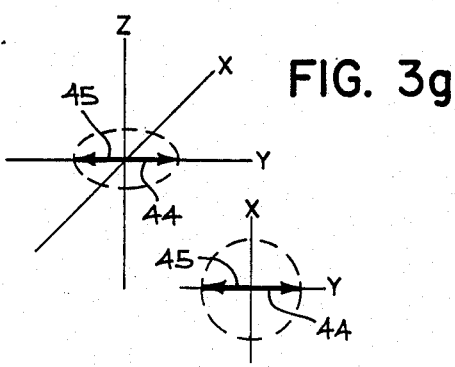
Figure 3H:
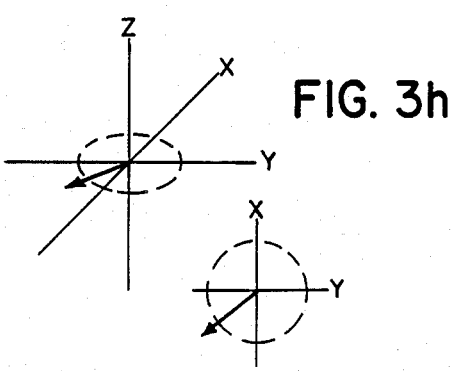

As shown in FIG. 3d, at the time $t_c$ when the second RF excitation pulse 21 is applied, the various out-of-phase components of the spin magnetization may be resolved into components in the ±x direction and components in the ±y direction. At time $t_d$, after the application of the RF excitation pulse 21 along the x-axis of the rotating frame, the y components are tipped along the ±z axis as shown at 42 and 43 in FIG. 3e. During the subsequent time period $t_1$, the components along the ±z axis are modulated while the untipped x components that remain in the transverse plane dephase further in the presence of gradient 30. This gradient also serves to dephase (destroy) all multiple quantum coherence leaving only zero quantum coherence which is insensitive to magnetic field inhomogeneities. As a result, after the time period $t_1$ when the third RF excitation pulse 22 is applied at time $t_e$, there are components 42' and 43' along the ±z axis, while the components in the transverse plane have completely dephased to produce no net magnetization. This is illustrated in FIG. 3f. The third excitation pulse 22 tips the ±z axis magnetization back into the transverse plane where the phase information that was acquired during the first TE/2 time period is preserved. This is illustrated at 44 and 45 in FIG. 3g. During the final TE/2 time period, therefore, the previously out of phase components rephase to produce the echo NMR signal 23. The spin magnetization at this point in time is illustrated in FIG. 3h, where the transverse magnetization is responsible for producing the NMR echo signal at the time $t_g$.

Coupled spins which are not separated by the same chemical shift will not experience the same frequency of amplitude modulation and it is a teaching of the present invention that this fact may be employed to filter out spectral components produced by uncoupled spins and other types of coupled spin systems which would have different zero quantum modulation frequencies.

To practice the preferred embodiment of the present invention, therefore, the echo pulse sequence of FIG. 2 is executed twice. On the first pass the value of $t_1$ is set to 8 milliseconds (or 4 msec increments thereof at 2.0T) and the echo signal 23 is acquired and digitized. The echo pulse sequence is then reexecuted with the value of delay $t_1$ set to 10 milliseconds (or 4 msec increments thereof at 2.0T) $(8 + \frac{1}{2}*(250 \times 10^{-3}))$. The NMR echo signal 23 is again acquired and digitized. The arithmetic difference between the amplitudes of the two digitized NMR signals is then calculated and the resulting difference signal is processed to produce a spectrum of the components.

The resulting difference signal suppresses spectral components which are produced by uncoupled spins such as water protons. In addition, the difference signal suppresses spectral components which are produced by spins that are coupled with a different zero quantum modulation frequency such as lipid protons. As a result, the spectral components produced by the lactate protons are enhanced relative to water and lipids.

Figure 4:
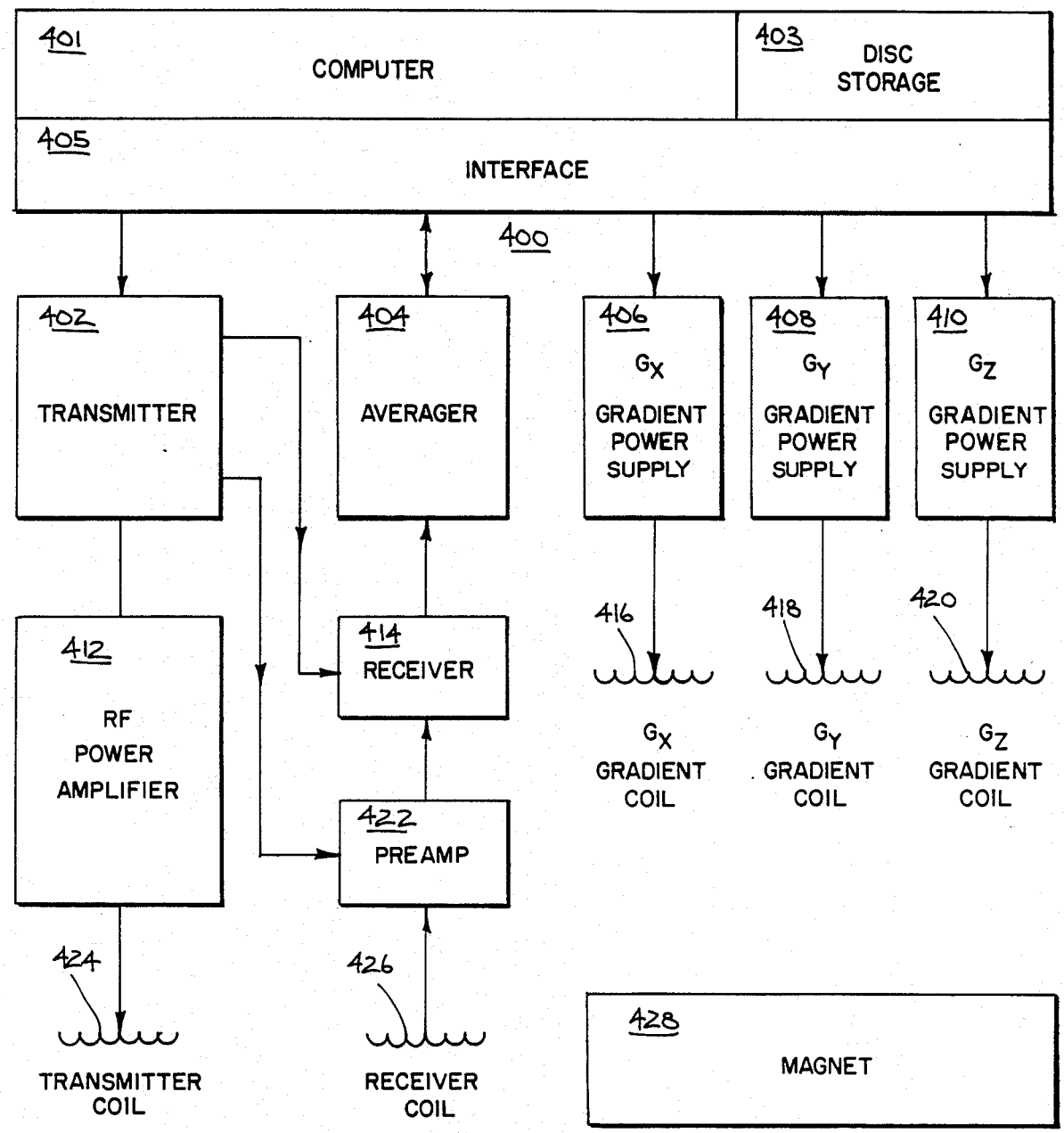
FIG. 4 is a simplified schematic diagram of the NMR system which employs the present invention.

FIG. 4 is a simplified block diagram of the major components of an NMR system suitable for use with the NMR pulse sequences of the invention described herein. The system, generally designated 400, is made up of a general purpose minicomputer 401 which is functionally coupled to disk storage unit 403 and an interface unit 405. An RF transmitter 402, signal averager 404, and gradient power supplies 406, 408, and 410 for energizing, respectively, $G_x$, $G_y$, $G_z$ gradient coils 416, 418, and 420, are coupled to computer 401 through interface unit 405.

RF transmitter 402 contains an RF oscillator oscillating at the desired Larmor frequency. If the sensitive volume is scanned by varying the frequency of the RF pulse, this can be done automatically from the computer using a commercially available programmable frequency synthesizer. The transmitter is gated with pulse envelopes from computer 401 to generate RF pulses having the required modulation to excite resonance in the object under study. The RF pulses are amplified in RF power amplifier 412 to levels varying from 100 watts to several kilowatts, depending on the NMR method, and applied to transmitter coil 424. The higher power levels are necessary for large sample volumes, and where short duration pulses are required to excite large NMR frequency bandwidths.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for the NMR pulses, blanking for the preamplifier and RF power amplifier, and voltage waveforms for the gradient power supplies and advances the gradients and the frequency of RF pulses during scanning. The computer also performs data processing such as Fourier transforms, data filtering, and storage functions (all of which are operations conventionally performed by minicomputers and hence described only functionally, supra).

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the fields of coils are orthogonal to the direction of the static magnetic field $B_0$ produced by magnet 428 (FIG. 4). The coils are isolated from the remainder of the system by enclosure in an RF shielded case. Three typical RF coil designs are illustrated in FIGS. 5a, 5b and 5c. All of these coils produce RF magnetic fields in the x-axis direction. The coil designs illustrated in FIGS. 5b and 5c are suitable for magnetic geometries for which the axis of the sample chamber is parallel to the main field $B_0$, whereas the design illustrated in FIG. 5a is applicable to geometries for which the sample chamber axis is perpendicular to the main field $B_0$.

Magnetic field gradient coils 416, 418, and 420 (FIG. 4) are necessary to provide gradients $G_x$, $G_y$ and $G_z$, respectively. In the NMR pulse sequences described herein, the gradients should be monotonic and linear over the sample volume. Non-monotonic gradient fields cause a degradation in the NMR signal data, known as aliasing, which leads to severe artifacts. Nonlinear gradients cause geometric distortions of the data.

A design for gradient coils suitable for magnet geometries with a sample chamber axis parallel to the main field $B_0$ is depicted in FIGS. 6a and 6b. Each of the gradients $G_x$ and $G_y$ is produced by a set of coils such as sets 300 and 302 depicted in FIG. 6a. The coil sets as illustrated in FIG. 6a produce gradient $G_x$. The coil sets for producing gradient $G_y$ are rotated 90°. The $G_z$ gradient is generated by a coil pair such as coils 400 and 402 shown in FIG. 6b. If the sensitive volume is scanned by changing the ratio of currents in the gradient coils, each half, for example, 300 and 302 in FIG. 6a and 400 and 402 in FIG. 6b, can be driven by a separate power supply so that supplies 406, 408, 410 in FIG. 4 each may actually consist of two power supplies.

While this invention has been and is described with reference to particular embodiments and examples, other modifications and variations will occur to those skilled in the art in view of the above teachings. Accordingly, it should be understood that within the scope of the appended claims the invention may be practiced otherwise than is specifically described.

For example, the method may be employed in combination with other techniques for suppressing undesired spin resonances. An RF excitation pulse of limited bandwidth and having a center frequency at the undesired spin resonance may be applied along with a gradient pulse prior to the commencement of the invented pulse sequence. This further suppreses the NMR signal produced by the undesired spin resonance. In addition, by altering the phase of the RF excitation pulses during successive sequences, phase cycling methods may be employed with the present invention in order to suppress artifacts caused by events outside the region of interest. And finally, RF excitation pulses which mutate, or tip, the spin magnetization 180° may be inserted midway between the first and second RF pules of the invented sequence or in the middle of the second TE/2 period in order to compensate for off-resonance effects.

I claim:

1. A method for producing an NMR signal which indicates the in vivo proton spectra of metabolites, the steps comprising:
   (a) applying a polarizing magnetic field to the region of interest;
   (b) applying a first RF excitation field pulse in the presence of a magnetic field gradient to produce transverse magnetization in the region of interest;
   (c) applying a second RF excitation field pulse in the presence of a magnetic field gradient to produce longitudinal magnetization in the region of interest at a time period (TE/2) after the first pulse, which time period (TE/2) has a value which is a function of the spin-spin coupling constant (j) of the metabolite molecule;
   (d) applying a third RF excitation field pulse in the presence of a magnetic field gradient to restore transverse magnetization in the region of interest at a time period ($t_1$) after the second pulse, which time period ($t_1$) has a value which is a function of the zero quantum modulation frequency (ZQMF) of the metabolite molecule;

(e) acquiring the echo NMR signal which is produced at a time period (TE/2) after the third pulse;

(f) repeating steps (a) through (e) with a different value for the second time period ($t_1$); and (g) producing a difference signal by subtracting one of the acquired echo NMR signals from the other acquired echo NMR signal.

2. The method as recited in claim 1 in which each of the three RF excitation field pulses is selective and three magnetic field gradient pulses are applied to the region of interest along each of three directions during the application of the respective three RF excitation field pulses to localize the region of interest from which the NMR echo signals are acquired.

3. The method as recited in claim 1 in which the first time period has a value:

$$TE/2 = n/2j$$

where n is an odd integer and j is the spin-spin coupling constant of the metabolite molecule.

4. The method as recited in claim 1 in which the second time period has two values which are different by an amount:

$$TM = \tfrac{1}{2} ZQMF$$

where ZQMF is the zero quantum modulation frequency of the metabolite molecule.

5. The method as recited in claim 1 in which the metabolite molecule is a lactate molecule.

* * * * *